United States Patent
Asakawa et al.

(10) Patent No.: US 11,410,848 B2
(45) Date of Patent: Aug. 9, 2022

(54) METHOD OF FORMING PATTERN, METHOD OF MANUFACTURING SEMICONDUCTOR DEVICE, AND PATTERN-FORMING MATERIAL

(71) Applicant: Kioxia Corporation, Tokyo (JP)

(72) Inventors: Koji Asakawa, Kawasaki Kanagawa (JP); Norikatsu Sasao, Kawasaki Kanagawa (JP); Shinobu Sugimura, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/997,115

(22) Filed: Aug. 19, 2020

(65) Prior Publication Data

US 2021/0296116 A1  Sep. 23, 2021

(30) Foreign Application Priority Data

Mar. 23, 2020 (JP) .............................. JP2020-051206

(51) Int. Cl.
 *H01L 21/027* (2006.01)
 *H01L 21/308* (2006.01)
 *H01L 21/311* (2006.01)

(52) U.S. Cl.
 CPC ...... *H01L 21/0271* (2013.01); *H01L 21/3086* (2013.01); *H01L 21/31144* (2013.01)

(58) Field of Classification Search
 None
 See application file for complete search history.

(56) References Cited

U.S. PATENT DOCUMENTS

| | | | | |
|---|---|---|---|---|
| 6,147,407 A | * | 11/2000 | Jin | ...................... C23C 14/0605 |
| | | | | 257/758 |
| 8,394,244 B1 | * | 3/2013 | Patterson | .......... H01L 21/67086 |
| | | | | 204/192.34 |
| 9,743,885 B1 | * | 8/2017 | Yao | ...................... A61B 5/1486 |

(Continued)

FOREIGN PATENT DOCUMENTS

| JP | 2018-160537 A | 10/2018 |
|---|---|---|
| JP | 2019-23251 A | 2/2019 |

(Continued)

OTHER PUBLICATIONS

Negishi et al., "Deposition control for reduction of 193 nm photoresist degradation in dielectric etching,": J. Vac. Sci. Technol. B (Jan/Feb. 2005), 23:217-223.

(Continued)

*Primary Examiner* — Shamim Ahmed
(74) *Attorney, Agent, or Firm* — Finnegan, Henderson, Farabow, Garrett & Dunner L.L.P.

(57) ABSTRACT

A method of forming a pattern of an embodiment includes: forming an etch mask on a film to be processed by using a pattern-forming material containing an organic polymer; and patterning the etch mask. In the method of the embodiment, the organic polymer contains 70 atom % or more carbon atoms having an $sp^2$ orbital and 5 atom % or more carbon atoms having an $sp^3$ orbital among the carbon atoms constituting the organic polymer. The patterned etch mask is used for etching of the film to be processed with a gas containing a fluorine atom.

3 Claims, 12 Drawing Sheets

(56) References Cited

U.S. PATENT DOCUMENTS

| | | | |
|---|---|---|---|
| 10,615,045 B2 | 4/2020 | Kori et al. | |
| 10,672,621 B2 | 6/2020 | Sasao et al. | |
| 2009/0017318 A1* | 1/2009 | Ruuttu | B23K 26/0821 |
| | | | 428/457 |
| 2018/0275519 A1 | 9/2018 | Kawanishi et al. | |
| 2019/0259606 A1 | 8/2019 | Yamamoto et al. | |
| 2020/0012187 A1 | 1/2020 | Komukai | |
| 2020/0291155 A1 | 9/2020 | Sasao et al. | |
| 2020/0291156 A1* | 9/2020 | Asakawa | C08L 33/10 |
| 2021/0082693 A1 | 3/2021 | Asakawa et al. | |

FOREIGN PATENT DOCUMENTS

| | | |
|---|---|---|
| JP | 2019-145714 A | 8/2019 |
| JP | 2020-2227 A | 1/2020 |
| JP | 2020-9869 A | 1/2020 |
| JP | 2020-147633 A | 9/2020 |
| JP | 2020-149037 A | 9/2020 |
| JP | 2021-48257 A | 3/2021 |

OTHER PUBLICATIONS

Coburn et al., "Plasma etching—A discussion of mechanisms," J. Vac. Sci. Technol. (Mar./Apr. 1979), 16:391-403.

K. Nojiri, "Dry Etching Technology for Semiconductors, Chapter 2: Mechanism of Dry Etching" Springer International Publishing (2015), pp. 11-30.

* cited by examiner

···(1)

···(2)

···(A)

···(B)

METHOD OF FORMING PATTERN, METHOD OF MANUFACTURING SEMICONDUCTOR DEVICE, AND PATTERN-FORMING MATERIAL

CROSS REFERENCE TO RELATED APPLICATION

This application is based upon and claims the benefit of priority from Japanese Patent Application No. 2020-051206, filed on Mar. 23, 2020; the entire contents of which are incorporated herein by reference.

FIELD

Embodiments disclosed here relate to a method of forming a pattern, a method of manufacturing a semiconductor device, and a pattern-forming material.

BACKGROUND

There are increasing demands for a technology of forming high aspect ratio patterns with the progress of three-dimensional devices in semiconductor devices. Since a mask pattern used for such a process is exposed to an etch gas for a long time, high etch resistance is required. Simultaneously it is also demanded to maintain a shape of a mask pattern as much as possible during etching. In other words, suppressing what is called shoulder-drop of the mask pattern is required.

SUMMARY

A method of forming a pattern of an embodiment includes: forming an etch mask on a film to be processed by using a pattern-forming material containing an organic polymer; and patterning the etch mask. In the method of forming the pattern of the embodiment, the organic polymer contains 70 atom % or more carbon atoms having an $sp^2$ orbital and 5 atom % or more carbon atoms having an $sp^a$ orbital among the carbon atoms constituting the organic polymer, and the patterned etch mask is used for etching of the film to be processed with a gas containing a fluorine atom.

A method of manufacturing a semiconductor device of an embodiment includes: forming an etch mask on a film to be processed by using a pattern-forming material containing an organic polymer; patterning the etch mask; and dry-etching the film to be processed with a gas containing a fluorine atom by using the patterned etch mask. In the method of manufacturing the semiconductor device of the embodiment, the organic polymer contains 70 atom % or more carbon atoms having an $sp^2$ orbital and 5 atom % or more carbon atoms having an $sp^a$ orbital among the carbon atoms constituting the organic polymer.

DETAILED DESCRIPTION

Figure 1A:
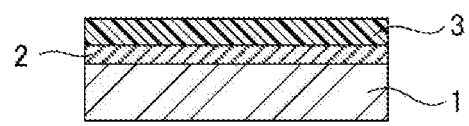
FIG. 1A to FIG. 1E are views illustrating a process of a method of forming a pattern of an embodiment.

Hereinafter, a method of forming a pattern and a method of manufacturing a semiconductor device according to embodiments will be described with reference to the drawings. Note that in each embodiment, substantially the same configuration portion will be given the same reference numeral and explanation thereof may be partially omitted. The drawings are schematic, and a relationship between a thickness and a plan dimension, a proportion of thicknesses of respective portions, and so on may be different from actual ones.

(Method of Forming Pattern)

Figure 1B:
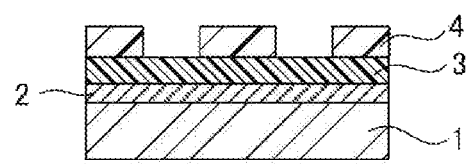

The method of forming the pattern of the embodiment will be described with reference to FIG. 1. FIG. 1 are cross-sectional views illustrating a process of the method of forming the pattern of the embodiment. In the method of forming the pattern illustrated in FIG. 1, first, as illustrated in FIG. 1A, a film to be processed 2 having been formed on a substrate 1 is prepared, and an etch mask 3 is formed on the film to be processed 2 by using a pattern-forming material containing a specific organic polymer. The film to be processed 2 is not particularly limited and various functional films are applicable. The etch mask 3 will be described in detail later. Next, as illustrated in FIG. 1B, a resist pattern 4 is formed on the etch mask 3. The resist pattern 4 is formed by forming a resist film on the etch mask 3 and then patterning the resist film by using a photo, electron beam or imprint lithography technology, or the like. For example, in the imprint technology, a resist is dropped on the etch mask 3, a template where a fine pattern is formed is pressed to the resist film, and the resist film is cured by irradiation of ultraviolet ray, to thereby form the resist pattern 4.

Figure 1C:
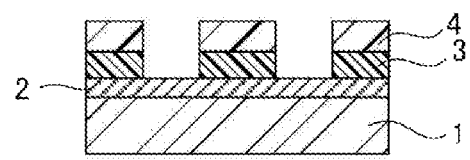
Figure 1D:
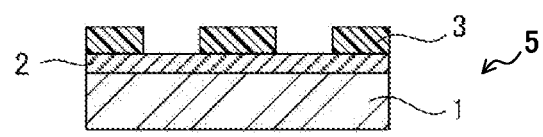

Next, as illustrated in FIG. 1C, with the resist pattern 4 being used as a mask, the etch mask 3 is etched by dry-etching to thereby be patterned. FIG. 1C illustrates the etch mask 3 having been patterned. Note that when a difference in etch rates to an etch gas between the resist film and the etch mask 3 is small, a silicon oxide ($SiO_2$) film or the like may be interposed between the resist film and the etch mask 3, so that the etch mask 3 may be patterned with the resist film and the $SiO_2$ film being used as a mask. Thereafter, as illustrated in FIG. 1D, the resist pattern 4 is removed, to thereby bring about a structure (pattern-forming body) 5 where the patterned etch mask 3 is provided on the film to be processed 2.

Figure 1E:
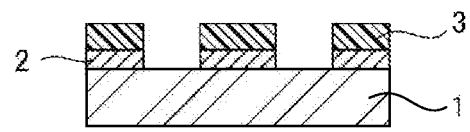

The pattern-forming body 5 is used for patterning the film to be processed 2 as illustrated in FIG. 1E. Concretely, the film to be processed 2 is exposed to an etch gas and dry-etched via the patterned etch mask 3. Thereby, the patterned film to be processed 2 is obtained. To dry-etching, reactive ion etching (RIE), ion beam etching (IBE), or the like, for example, is applied. As the etch gas, a gas containing a fluorine (F) atom is used. It is preferable that the etch gas contains fluorine (F) as fluorocarbon whose carbon number is 1 or more and 6 or less ($C_nF_{2n+2}$, $C_nF_{2n}$, $C_nF_{2n-2}$: n is a number of 1 or more and 6 or less), for example. The etch gas preferably further contains oxygen ($O_2$). In the etch gas containing the fluorine atom (F) and an oxygen atom (O), the fluorine atom is preferably contained more than 1:1 (atom:atom) in terms of proportion of the fluorine atom to the oxygen atom. Further, argon (Ar) or nitrogen ($N_2$) may be added as necessary. On this occasion, Ar or $N_2$ is not included in the proportion of the fluorine atom to the oxygen atom.

It is found that when the patterned film to be processed 2 is formed by using the etch gas containing the fluorine (F) atom as described above, maintaining a rectangular shape of the mask pattern is hard at the time of etching, in other words, shoulder-drop is likely to occur as will be described later, even if high etch resistance can be attained. Thus, in the method of forming the pattern of the embodiment, there is used a pattern-forming material containing an organic polymer constituted by 70 atom % or more carbon atoms having an $sp^2$ orbital (hereinafter, also referred to as $sp^2$ carbon atoms) and 5 atom % or more carbon atoms having an $sp^3$ orbital (hereinafter, also referred to as $sp^3$ carbon atoms) among the carbon atoms constituting the organic polymer contained in the pattern-forming material, and such a pattern-forming material is applied to an etch mask. According to such an etch mask, even in a case where a film to be processed 2 is patterned by using an etch gas containing a fluorine (F) atom, a shape of a mask pattern can be maintained both during etching and after etching. Hereinafter, maintenance of etch resistance and a suppressing effect on shoulder-drop by such an etch mask will be described.

Figure 2A:
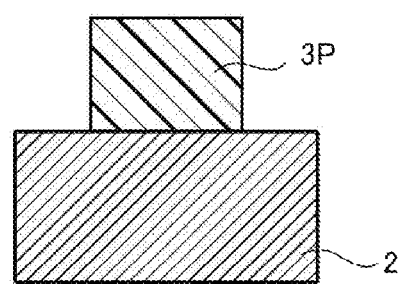
FIG. 2A and FIG. 2B are views illustrating shoulder-drop occurring in an etch mask of Comparative Example in a method of forming a pattern.
Figure 2B:
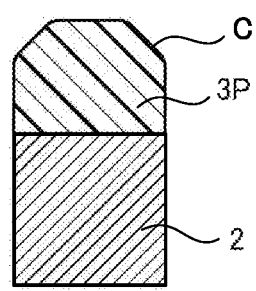

The above-described shoulder-drop is a phenomenon occurring at the time of etching a film or the like with a mask pattern. FIG. 2 illustrate cross-sectional views of the mask pattern before and after shoulder-drop occurs in the etch mask 3. FIG. 2A illustrates a state where a mask pattern 3P is formed on a film to be processed 2, and FIG. 2B illustrates a state where the film to be processed 2 has been processed by etching with the mask pattern 3P being used as a mask. In FIG. 2B, the mask pattern 3P is in a state where a corner portion C of a cross-section upper edge is lacking, and such a state is referred to as a state where the shoulder-drop has occurred. When the shoulder-drop occurs in the mask pattern 3P, a problem such as a deterioration of a dimensional accuracy of the film to be processed 2 arises. In the method of forming the pattern of the embodiment, the above-described configuration is applied to a molecular structure of an organic polymer contained in a pattern-forming material to become the etch mask 3P, whereby occurrence of the shoulder-drop is suppressed.

The present inventors have found out a problem that the shoulder-drop of the mask pattern 3P as illustrated in FIG. 2B is likely to occur as etch resistance of the mask material is enhanced in a dry-etching process. Shoulder drop occurs when the mask pattern is attacked by accelerated ions, the etch rate of the corner portion (shoulders portion) of the pattern increases, and its shape cannot be maintained by being scraped from the shoulder portion during the etching. For example, when a processing of high aspect ratio such as for a 3-dimensional device is required, the above-described shoulder-drop is quite a serious problem. As a result of earnest study of a cause of this problem, it is found that when etching using highly accelerated ions with high energy is performed, a factor of sputtering being physical etching becomes more effective, resulting the shoulder-drop likely to occur.

A mechanism of the etching by using the gas which contains the fluorine-based gas and the oxygen gas, RIE in particular, can be broken down into mainly three constituting factors of a chemical reaction by oxygen, a chemical reaction by fluorine (halogen), and sputtering by a physical collision by particles having high energy. For improvement of etch resistance which has been studied, there are suggested measures such as improvement of oxygen resistance by introducing metal into a mask material to acquire flame retardancy, improvement of halogen resistance by raising a composition ratio of carbon atoms to oxygen atoms in the mask material (Ohnishi Parameter: J. Electrochem. Soc. vol. 130, 143, 1983), and so on, and it is known that these measures exhibit effects on improvement of the etch resistance. However, these measures do not improve sputtering resistance, and on the contrary, sometimes aggravate shoulder-drop, so that a solution has been desired.

A sputtering mechanism can be explained by a cascade theory which is logically clarified by Sigmund et al. (Sigmund, Physical Review, 184, 383, 1969). At this time, among physical properties of a substance to undergo sputtering, one having a high correlation with a sputtering speed is bond energy between atoms. When ions are incident at lower energy than the bond energy, sputtering does not occur (threshold energy). Further, it is known that ions incident from a tangential direction (high-angle incidence) achieves a higher sputtering yield than ions incident from a normal direction (low-angle incidence). Consequently, the etch rate is increased in the corner portion (shoulder portion) of the mask pattern, so that the shoulder portion is shaved first. This phenomenon is more prominent when acceleration energy of ions becomes large.

Further, it is known that regarding dependence on an incident angle, the smaller an atomic number is, the higher a sputtering yield of a high angle is (Oechsner, Z. Physik, 261, 37, 1973). In other words, a peak angle of the sputtering yield shifts to a low angle side as an element becomes heavier. In the association of the above with the shoulder-drop phenomenon, a substance having a maximum value of a sputtering yield at a large angle is likely to be etched in a portion of a corner of a pattern, making shoulder-drop notable. In RIE, a gas and a by-product of the gas and redeposition of an atom, a molecule, or the like which has been hit by etching are also important factors. For example, in etching by using a fluorocarbon-based gas, deposition of F radical, $CF_2$ radical, or the like often occurs. It is known that consequently progress of etching is delayed or halted.

When a sample with a pattern constituted by anconventional resist material or the like is subjected to RIE, a film thickness is decreased by the etching. However, among pattern-forming materials having etch resistance of the same level, there are materials which are likely to be subjected to shoulder-drop and materials which maintain the shapes of corner portions and unlikely to be subjected to shoulder-drop. This is because of an influence of a deposition substance such as a $CF_x$-based substance or the like generated in the RIE. A substance substantially affecting a plasma process is $CF_2$ radical (Hori et al., J. Vac. Sci. Technol. A 16 233 1998). Supposing it is right, since radical cannot exist for a long time, it is considered that fluorine forms a chemical bond in some way and deposits on a polymer or the like. In this case, whether or not fluorine replaces an element constituting the polymer and is fixed can be found by comparing differences in bond energy between the elements. A material on which a fluorine atom is likely to deposit can be designed based on this understanding.

For the sake of simplification, with cyclohexane being taken as an alicyclic structure, when one hydrogen atom is replaced with one fluorine atom, bond energy is reduced by 175 kJ/mol. In contrast, when one hydrogen atom of the benzene ring is replaced with one fluorine atom, bond energy is reduced only by 38 kJ/mol. Further, since an atomic radius of the fluorine atom is larger than that of the hydrogen atom, replacement with the fluorine atom increases a volume. For example, it is known that a hydrogen atom of alkane is easily replaced with a fluorine atom, and a volume of alkane fluoride is larger than that of alkane because of a difference in atomic radius. Since the reaction of replacing hydrogen with fluorine positively correlates with a difference in heat of formation between a starting material and a reaction product, it makes sense that alkane brings about more deposition of the $CF_x$-based substance, resulting in smaller shoulder-drop. It is forecasted that, consequently, when RIE is performed with a fluorine-based gas, part of alkane is fluoridated, to thereby increase a volume of a pattern.

Further, it is known that in relation to bond energy, for example, aluminum (Al) is more stable in fluoride than in oxide. This explains the reason why when a metal infiltrating treatment (metallization) is performed on an organic material, for example, etching progresses by dissociating Al—O bond of a reaction product $(Al(OH)_x)$ formed in the organic material. Concretely, since hydrogen of a substituent ($CH_3$—$CH_2$—, or the like) of alkane is likely to be released and replaced with fluorine, a corner portion of a pattern is expected to be protected. Further, a similar reaction in RIE is expected also in a case where a fluorine molecule ($F_2$) is used, since F radical takes part in a reaction of replacing a hydrogen atom (H) of alkane. In other words, as a characteristic of an organic polymer with which a shoulder of a pattern is protected, it is considered that an alkane chain or the like is added to a side chain of a polymer chain, especially on an outer side of the side chain.

However, in the method of forming the pattern of the embodiment, it is required to obtain a pattern-forming material containing an organic polymer excellent also in etch resistance in addition to the above-described characteristic. Compared with an aromatic ring such as a benzene ring, alkane is inferior in etch resistance regardless of being in a ring shape or being in a chain shape. Therefore, a main portion of the organic polymer used in the method of forming the pattern of the embodiment is desirable to be constituted by the aromatic ring or the like. However, though the polymer constituted by the aromatic ring has high dry-etch resistance, a corner portion of a pattern tends to be easily shaved and that polymer is inferior in view of shoulder-drop. Therefore, shoulder-drop is considered to be able to be reduced by constituting a main chain portion of an organic polymer basically by an aromatic ring to maintain high dry-etch resistance, and, for example, by adding alkane or the like on an outer side of a polymer chain as an antenna capable of catching a fluorine atom.

Concretely, a specific organic polymer contained in the pattern-forming material of the etch mask is constituted by 70 atom % or more carbon atoms having an $sp^2$ orbital (hereinafter, also referred to as "$sp^2$ carbon atom") and 5 atom % or more carbon atoms having an $sp^3$ orbital (hereinafter, also referred to as "$sp^3$ carbon atom") in relation to all the carbon atoms. The carbon atoms of the aromatic ring constitute double bonds of the $sp^2$ carbon atom. A bonding force between the carbon atoms is strong and the aromatic ring is excellent in dry-etch resistance. Therefore, the carbon atoms constituting the organic polymer are preferable to be constituted by mainly the carbon atoms having the $sp^2$ orbital. Carbon having the $sp^2$ orbital may include $sp^2$ carbon atoms of a carbonyl group (—C(=O)—), a carboxyl group (—C(=O)—O—H), and a bivalent group (—C(=O)—O—) based thereon. In view of dry-etch resistance, the $sp^2$ carbon atoms are preferable to make up 70 atom % or more of all carbon. Further, increasing the proportion to 85 atom % or more further improves the dry-etch resistance.

In contrast, since the carbon atoms of alkane are linearly connected by an $sp^3$ orbital and a bond of carbon-carbon is a single bond, a bonding force is relatively weak. Therefore, alkane is inferior in etch resistance. Note that the bonding by the $sp^3$ orbital exhibits high dry-etch resistance in three-dimensional network such as diamond and diamond-like carbon. Though the $sp^3$ carbon atoms constituting alkane may be smaller in number compared with the $sp^2$ carbon atoms, it is preferable that 5 atom % or more $sp^3$ carbon atoms are contained in relation to all the carbon atoms constituting the organic polymer. Further, when alkane exists on a surface of a polymer chain, alkane is likely to react with fluorine to form fluoride by a steric effect. At this time, in the organic polymer contained in the pattern-forming material used for the etch mask, a carbon atom which is apart by 4 or more in the number of atoms from a constituent atom constituting a main chain is preferable to be the $sp^3$ carbon atom. Thereby, hydrogen is likely to be replaced with fluoride by the steric effect, so that an effect of maintaining the shape of the pattern after etching can be enhanced.

As described above, the etch mask 3 used in the method of forming the pattern of the embodiment contains the organic polymer in the pattern-forming material used for forming the etch mask 3, and contains 70 atom % or more carbon atoms having the $sp^2$ orbital and 5 atom % or more carbon atoms having the $sp^3$ orbital among the carbon atoms constituting the organic polymer. It is further desirable that 80 atom % or more carbon atoms having the $sp^2$ orbital are contained for the sake of improvement of etch resistance. The etch mask 3 may be an organic film constituted only by the above-described organic polymer or may be a later-described composite film obtained by infiltrating an organic film with a metallic compound. A process of constituting a organo-metalic material composite body by infiltrating an organic film with a metallic compound is referred to as metallization. Note that a part of carbon atoms contained in the organic material may be a carbon atom having an sp orbital.

Figure 3:
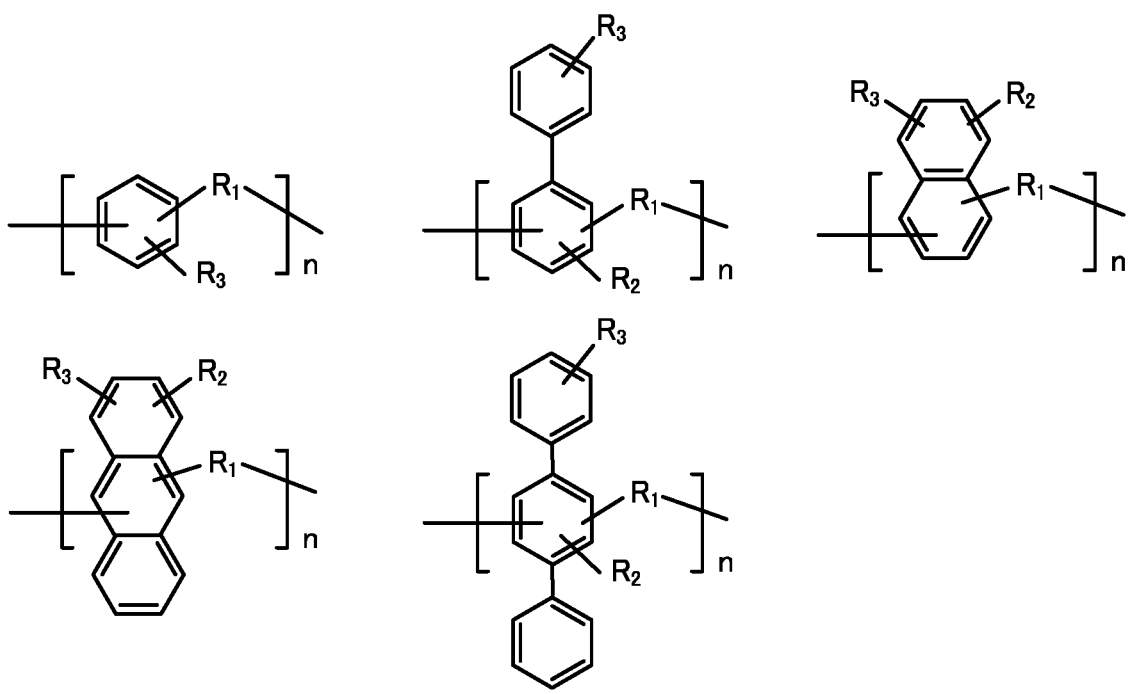
FIG. 3 is a diagram illustrating an example of an organic polymer constituting an etch mask used in the method of forming the pattern of the embodiment.
Figure 4:
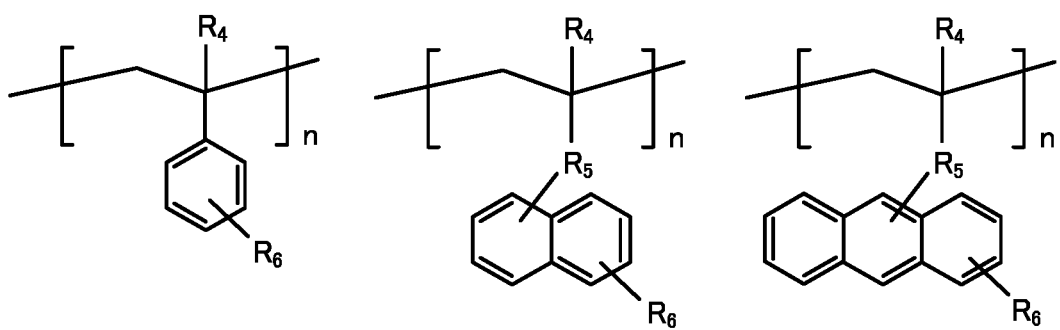
FIG. 4 is a diagram illustrating an example of the organic polymer constituting the etch mask used in the method of forming the pattern of the embodiment.

FIG. 3 and FIG. 4 illustrate examples of organic polymers contained in the pattern-forming material used for forming the etch mask by the method of forming the pattern of the embodiment. Examples of the organic polymer containing 70 atom % or more $sp^2$ carbon atoms include a polymer containing an aromatic ring as a main chain, as illustrated in FIG. 3, for example. The aromatic ring is not limited to the benzene ring and may be a polycyclic aromatic ring such as a naphthalene ring and an anthracene ring, as illustrated in FIG. 3. Alternatively, the polycyclic aromatic ring may be a pyrene ring. In the diagram, $R_1$ includes any one of an alkyl chain (—$CH_2$—), ether (—O—), ester (—C(=O)—O—), amide (—C(=O)—NH—), imide (—C(=O)—NH—C(=O)), and sulfonyl (—$SO_2$—), or, sometimes an atom is not placed. $R_2$ includes any one of an aromatic ring, a hydroxyl group (—OH), a carboxyl group (—COOH), an amino group (—$NH_2$), a nitro group (—$NO_2$) and a sulfonic group (—$SO_2OH$), or is a hydrogen atom (—H). $R_3$ indicates an alkyl group having a straight chain or a branch or a cycloalkyl group of the embodiment in which the carbon number is 1 or more and 6 or less.

It suffices that the organic polymer of the embodiment contains 70 atom % or more $sp^2$ carbon atoms even when the main chain does not contain the aromatic ring, as illustrated in FIG. 4. $R_4$ includes any one of a hydrogen atom, a halogen atom, a methyl group, and an ethyl group, and $R_5$ includes any one of an alkyl chain (—$CH_2$—), ether (—O—), ester (—C(=O)—O—), amide (—C(=O)—NH—)), imide (—C(=O)—NH—C(=O)), and sulfonyl (—$SO_2$—), or, sometimes an atom is not placed. $R_6$ indicates an alkyl group having a straight chain or a branch or a cycloalkyl group of the embodiment in which the carbon number is 1 or more and 6 or less.

As the organic polymer of the embodiment, the polymers illustrated in FIG. 3 and FIG. 4 can be used independently, but in general, a copolymer obtained by combining these is used in order to fulfil improvement of various necessary properties. Alternatively, the pattern-forming material of the embodiment may contain a material other than the organic polymer. Further, when used as the etch mask 3, the pattern-forming material of the embodiment may be an organic film constituted only by the above-described organic polymer and may be a later-described composite film obtained by infiltrating an organic film with a metallic compound. Alternatively, the pattern-forming material of the embodiment may contain materials other than the organic polymer. In that case, it suffices that the organic polymer makes up 70 wt % or more of the pattern-forming material except a solvent.

The side chain of the organic polymer may contain not only the aromatic ring or the hydrocarbon group, but also a hydroxyl group (—OH), a carboxyl group (—COOH), an amino group (—$NH_2$), a nitro group (—$NO_2$), sulfonic acid (—$SO_2OH$), or the like, and may further contain an alkyl group (—$C_nH_{n+2}$). The organic polymer may be a material obtained by bonding an aromatic ring to a main chain constituted by an aliphatic hydrocarbon group (—$CH_2$—, or the like), such as polystyrene, for example. For improving etch resistance, it is preferable that in the organic polymer, 80 atom % or more of the $sp^2$ carbon atoms is constituted by the aromatic rings.

Figure 5:
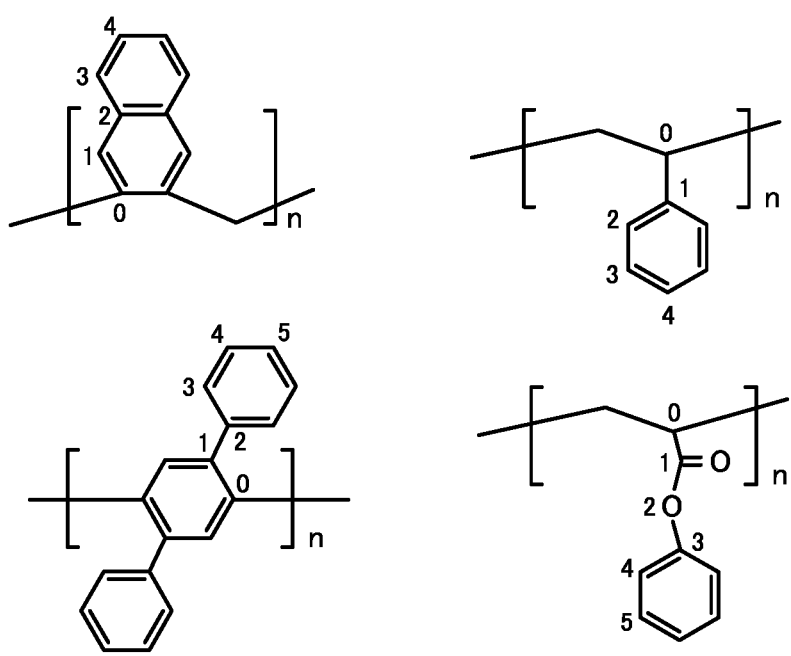
FIG. 5 is a diagram illustrating an example of the organic polymer constituting the etch mask used in the method of forming the pattern of the embodiment.

The aforementioned group containing the $sp^3$ carbon atom is preferable to contain carbon apart by 4 or more in the number of atoms from the atom constituting the main chain. FIG. 5 explains details of the "number of atoms from the main chain" defined in the embodiment. The numeral in FIG. 5 indicates the "number of atoms" from the atom in a connecting portion of the main chain, and indicates the "number of atoms from the main chain" of the embodiment. The "atom" is often a carbon atom, but may be an atom other than a hydrogen atom which constitutes a general organic compound, such as a nitrogen atom, an oxygen atom, and a sulfur atom. Note that the carbon atom may be the $sp^2$ carbon atom or $sp^3$ carbon atom. A polymer chain is a long chain, which intertwines randomly as a thread. Therefore, when a molecule such as a precursor comes from the outside, the molecule is hard to approach the atom close to the main chain. When the atom is far from the main chain, steric hindrance is relieved, so that deposition/substitution reaction of the fluorine atom, which is a mechanism of the embodiment, becomes likely to occur. Those aspects can be calculated by using a molecular orbital method or a molecular dynamics method. Based on the above reason, the hydrogen atom added to the $sp^3$ carbon atom contained in the main chain or the $sp^3$ carbon atom close to the main chain has a low probability of being replaced with the fluorine atom. In contrast, the hydrogen atom added to the $sp^3$ carbon atom far from the main chain can be easily replaced with the fluorine atom.

Regarding the $sp^3$ carbon atom contained in the above-described organic polymer, the organic polymer is preferable to be constituted by an alkyl group which has a linear chain or a branch or a cycloalkyl group. In FIG. 3 and FIG. 4, $R_3$ or $R_6$ indicates the alkyl group or the cycloalkyl group. The alkyl group may have either one of a linear-chain structure and a structure with a branch. Both of these groups contain the $sp^3$ carbon atom, and replacement of a hydrogen atom with a fluorine atom is likely to occur in an etching process by using an etch gas containing fluorocarbon or the like. Consequently, so-called deposition is likely to occur on a pattern surface and especially in a corner portion, so that shoulder-drop of a mask pattern after etching can be suppressed. The group containing $sp^a$ carbon atom is preferable to be an alkyl group or a cycloalkyl group whose carbon number is 1 or more and 6 or less.

Next, metallization of an organic film will be described. For example, metallization of the etch mask 3 as the patterned organic film illustrated in FIG. 1D brings about a metallized etch mask (mask pattern) 3. Metallization of the organic film is performed as follows, for example. A stack obtained by forming a film to be processed 2 and an organic film 3 sequentially on a substrate 1 is carried in a vacuum device and the organic film 3 is exposed to a gas or a liquid of a metallic compound such as trimethylaluminum (TMA) as a metal-containing fluid. At this time, a molecule of the metallic compound is absorbed by a carbonyl group or the like in the organic film 3, for example, and a terminal group (hydrocarbon group, for example) of the carbonyl group is eliminated. Then, a structure in which a metallic compound ($Al(CH_3)_x$) or the like is bonded firmly with an oxygen atom in the organic film 3 is formed. An exposure treatment of the metallic compound to the organic film 3 is preferable to be performed under heating. A heating temperature is appropriately selected in accordance with the kind of the metallic compound and the kind of an organic material constituting the organic film 3.

As the metallic compound, a metallic compound used in a CVD method or an atomic layer deposition (ALD) method can be used without limitation in particular. Examples of metal contained in the metallic compound include aluminum, titanium, tungsten, vanadium, hafnium, zirconium, tantalum, molybdenum, and so on. Among the organic metallic compound and halide thereof, one having a sufficiently small ligand is usable as the metallic compound. Concretely, examples of the usable metallic compounds include $AlCl_3$, $TiCl_4$, $WCl_6$, $VCl_4$, $HfCl_4$, $ZrCl_4$, $Al(CH_3)_3$, and so on. Metallization of the organic film may be performed not only in a gas phase but also in a liquid phase.

(Method of Manufacturing Semiconductor Device)

Figure 6A:
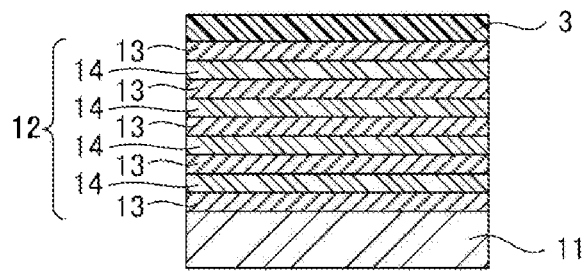
FIG. 6A to FIG. 6E are views illustrating a process of a method of manufacturing a semiconductor device of an embodiment.

Next, a method of manufacturing a semiconductor device of an embodiment will be described with reference to FIG. 6. FIG. 6 are cross-sectional views illustrating a process of the method of manufacturing the semiconductor device of the embodiment. In the method of manufacturing the semiconductor device illustrated in FIG. 6, first, as illustrated in FIG. 6A, a film to be processed 12 is formed on a semiconductor substrate 11. The film to be processed 12 is a stacked film obtained by alternately stacking silicon nitride 13 and a silicon oxide film 14, for example. The stacked film is used for manufacturing a three-dimensionally stacked nonvolatile memory device which has a memory cell of a vertical transistor structure, for example. An etch mask 3 for which a pattern-forming material containing a specific organic polymer is used is formed on the film to be processed 12 made of the above stacked film. The etch mask 3 is similar to the aforementioned etch mask used in the method of forming the pattern of the embodiment described above.

Figure 6B:
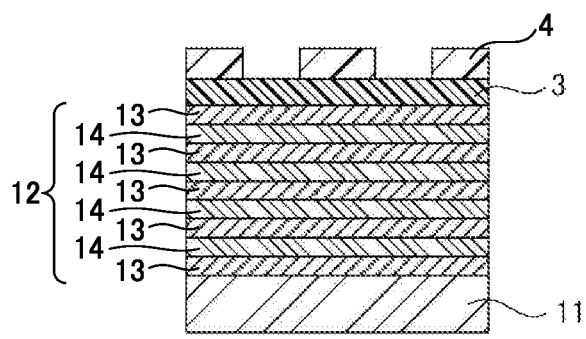
Figure 6C:
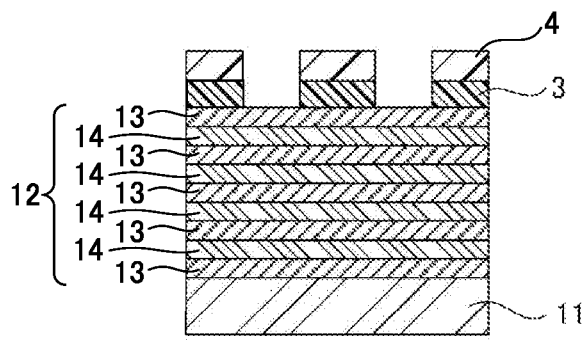
Figure 6D:
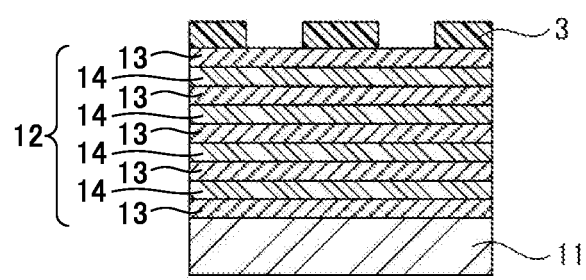

Next, as illustrated in FIG. 6B, a resist pattern 4 is formed on the etch mask 3. The resist pattern 4 is formed by patterning a resist film formed on the etch mask 3, by using a photo, electron beam or imprint lithography technology, or the like similarly to the method of forming the pattern of the embodiment. Next, as illustrated in FIG. 6C, with the resist pattern 4 being used as a mask, the etch mask 3 is etch-processed by dry-etching, to thereby be patterned. As illustrated in FIG. 6D, after the resist pattern 4 is removed, the film to be processed 12 is exposed to an etch gas via the patterned etch mask 3, to thereby be dry-etched. By such dry-etching, the film to be processed 12 having been patterned is obtained as illustrated in FIG. 6E.

To dry-etching, RIE, IBE or the like is applied. As the etch gas, a gas containing a fluorine atom (F) is used. It is preferable that the etch gas contains fluorine (F) as fluorocarbon whose carbon number is 1 or more and 6 or less ($C_nF_{2n+2}$, $C_nF_{2n}$, $C_nF_{2n-2}$: n is a number of 1 or more and 6 or less), for example. The etch gas is preferable to further contain an oxygen gas ($O_2$). In the etch gas containing the fluorine atom (F) and the oxygen atom (O), regarding a proportion thereof, it is preferable that the fluorine atom is contained more than 1:1 (atom:atom) in terms of proportion of the fluorine atom to the oxygen. Usage of such an etch gas containing the fluorocarbon and so on enables effective etching of the above-described film to be processed 12 such as the stacked film.

As described in the aforementioned method of forming the pattern of the embodiment, by applying the etch mask 3 containing the specific organic polymer, high etch resistance can be obtained even when the film to be processed 12 is dry-etched with the etch gas containing fluorocarbon or the like, and shoulder-drop of the pattern of the etch mask 3 after etching can be suppressed. Therefore, even in a case of forming a pattern having a hole with a high aspect ratio or the like as in the film to be processed 12 illustrated in FIG. 6A to FIG. 6D, a pattern-forming accuracy of the film to be processed 12 can be enhanced. Thereby, it becomes possible to improve a forming accuracy, a manufacturing yield, or the like of a semiconductor. Note that in the method of manufacturing the semiconductor of the embodiment, the film to be processed 12 is not limited to the above-described stacked film but various films are applicable.

Figure 6E:
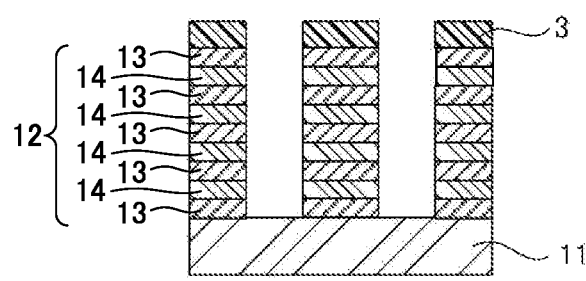
Figure 7A:
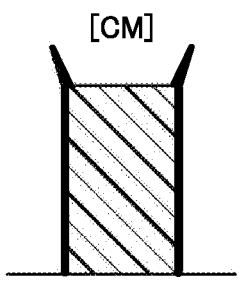
FIG. 7A to FIG. 7F are views illustrating corner portion shapes of patterns after etching of etch masks used in Reference Example 1 and Comparative Example 1.
Figure 7B:
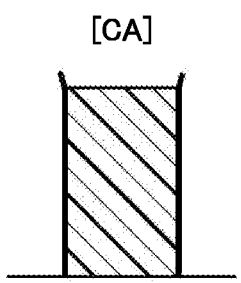
Figure 7C:
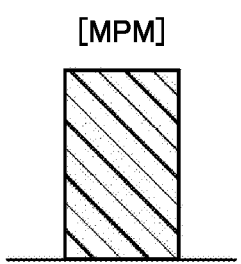
Figure 7D:
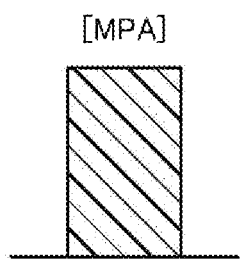
Figure 7E:
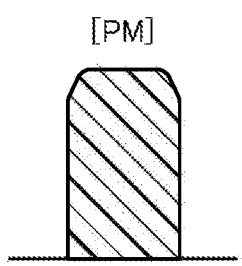
Figure 7F:
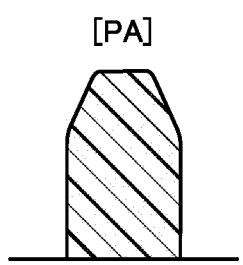

The film to be processed 12 having been patterned which is illustrated in FIG. 6E is applied to production of a memory cell array, by using a known method, for example. For example, a hole pattern (memory hole) is formed in a stacked film by the above-described processing. A block insulation layer, a charge storage layer, a tunnel insulation layer, a channel layer, and a core layer are sequentially formed in that memory hole. Further, only a nitride film among the stacked film is removed via a slit formed separately from the memory hole, and a conductive film is embedded in a space generated by the removal. This brings about a stacked film in which the insulation film (oxide film) and the conductive film are alternately stacked, so that a memory cell structure of a vertical transistor structure can be formed. The conductive film in the stacked film can be made to function as a word line.

EXAMPLES

Hereinafter, the present embodiment will be described further in detail by using examples, but the present embodiment is not limited to these examples. In order to confirm the reaction of etch mask of the embodiment, model compounds are synthesized and evaluation results of their characteristics are shown.

Reference Example 1, Comparative Example 1

To Reference Example 1 and Comparative Example 1, acrylic resin is applied. First, as a polymer considered likely to be fluoridated, cyclohexyl methacrylate (CM) and cyclohexyl acrylate (CA) in which cycloalkane is added to a side chain are each polymerized to produce a polymer (Reference Example 1). Further, as a polymer which is considered unlikely to be fluoridated, phenyl methacrylate (PM) and phenyl acrylate (PA) in which a benzene ring is added to a side chain are each polymerized to produce a polymer (Comparative Example 1).

Further, 4-methylphenyl methacrylate (MPM) and 4-methylphenyl acrylate (MPA) are selected and each polymerized to produce a polymer. These polymers are similar in structures, and a difference is in that a six-membered ring of the side chain is cyclohexane being cycloalkane or a benzene ring being an aromatic ring, so that it is possible to genuinely observe an shoulder-drop effect by deposition of a fluorine atom.

For the sake of solvent resistance, 2 mol % glycidyl methacrylate (GM), which is crosslinkable, is copolymerized to all the polymers. Though 2 mol % GM is a sufficient percentage to give solvent resistance by crosslinking, its amount is small enough to be able to be ignored when an shoulder-drop property after an RIE reaction is checked. Citric acid is mixed as a counterpart crosslinking agent to GM being a crosslinking group of those polymers, and a mixture is dissolved in a cyclohexanone solvent. At this time, GM and citric acid is mixed so that a molar ratio of glycidyl groups of GM and carbonyl groups of citric acid may be equal in a molar ratio. Spin-coating and annealing are carried out to perform crosslinking.

It is confirmed that when crosslinking occurs, resistance to a propylene glycol monomethyl ether acetate (PGMEA) solvent being a resist solution exhibits, enabling pattern exposure after application of a resist, and that the PGMEA solvent resistance is present by annealing of 200° C. or more. A film thickness is adjusted to be about 1.5 μm by a concentration and a rotation number. Thereon, JSR NSC SOG270-61 is applied in a thickness of 50 nm as spin on glass (SOG), and the SOG is cured at 200° C. Further, thereon, an i-line resist (Fuji, FHi-672B) is applied in a thickness of 0.4 μm. A line-and-space (L/S) pattern and a contact hole (CH) pattern are impressed by using an i-line exposure unit, and development is carried out with a tetramethylammonium hydroxide (TMAH) aqueous solution, to thereby perform patterning. After the SOG is removed by $CF_4RIE$ with the obtained resist pattern being used as a mask, $O_2RIE$ is performed, the above-described polymer film is etched to transfer the pattern, and thereafter, the resist is removed with the PGMEA solvent.

RIE is performed on each sample described above by using a $CF_4$ gas as an etch gas. The results show that in comparison of shoulder-drop amounts, the order is PA≥PM>>MPA≥MPM>CA≥CM both in the L/S pattern and the CH pattern. Thereby, it is found that CA and CM constituted by cycloalkane are smaller in terms of shoulder-drop amounts than PA and PM mainly constituted by the aromatic ring. Further, shoulder-drop is not found in MPM and MPA in which a methyl group is added to a tip of the benzene ring. Further, the shoulder-drop tends to be smaller in the case of methacrylic acid, though with a slight difference, than in the case of acrylic acid. Based on the above, it turns out that alkane is superior to the aromatic ring in resistance to shoulder-drop. FIG. 7A to FIG. 7F illustrate pattern shapes after etching of each sample. In FIG. 7A to FIG. 7F, a portion shown by a thick line indicates deposition by etching, for example.

The above are results of acrylic polymers, and the same thing happens if the benzene ring with high RIE resistance is replaced with a naphthalene ring, an anthracene ring, or a phenanthrene ring. In other words, comparing naphthylacrylate and methyl-naphthylacrylate by a similar method, the shoulder-drop is smaller when a methyl group is added. Similarly, in the case of anthracyl acrylate and phenanthryl acrylate, the shoulder-drop is smaller when a methyl group is added. The ethyl group exhibits a larger effect on preventing the shoulder-drop than the methyl group, and further, alkane which has the larger carbon number is more effective. However, the excessively extended alkyl group causes deterioration of etch resistance, which is quite important. Therefore, the carbon number of the alkyl group is preferable to be 6 or less. Further, when RIE is carried out with a mixed gas of a fluorine-based gas and an oxygen gas, a similar tendency can be obtained.

The above verification results confirm a basic concept of the embodiment. However, in acrylic resin, a main chain is constituted by a single bond, and further, each ester bond contains two oxygen atoms. Therefore, RIE resistance is not high in view of Ohnishi parameter, and thus, the concept of the embodiment will be further verified with materials having high etch resistance.

Example 1, Comparative Example 2

To Example 1 and Comparative Example 2, styrene-based resin is applied. First, polystyrene (PS), poly(4-methylstyrene) (P4MS), poly(2-vinylnaphtalene) (PVN), poly(2-phenyl-6-methylnaphthalene) (P6MVN) are each polymerized. Similarly to Reference Example 1, 2 mol % GM is copolymerized as a crosslinking group. Further, azobis(isobutyronitrile) (AIBN) is used as a polymerization initiator, and tetrahydrofuran (THF) is used as a synthetic solvent.

Similarly to Reference Example 1, as a counterpart crosslinking agent to GM being the crosslinking group of those polymers, citric acid is dissolved in a cyclohexanone solvent. At this time, mixing is carried out so that glycidyl groups of GM and carbonyl groups of citric acid may be equal in a molar ratio. Spin-coating and annealing are carried out to perform crosslinking. It is confirmed that when crosslinking occurs, resistance to a PGMEA solvent exhibits, enabling pattern exposure after application of a resist, and that the PGMEA solvent resistance is present by annealing of 200° C. or more. A film thickness is adjusted to be about 1.5 μm by a concentration and a rotation number. Thereon, JSR NSC SOG270-61 is applied in a thickness of 50 nm as SOG, and the SOG is cured at 200° C. Further, thereon, an i-line resist (Fuji, FHi-672B) is applied in a thickness of 0.4 μm. A line-and-space (L/S) pattern and a contact hole (CH) pattern are impressed by using an i-line exposure unit, and development is carried out with a TMAH aqueous solution to thereby perform patterning. After the SOG is removed by $CF_4$RIE with the obtained resist pattern being used as a mask, $O_2$RIE is performed, the above-described polymer film is etched to transfer the pattern, and thereafter, the resist is removed with the PGMEA solvent.

RIE is performed on each sample described above by using a $CF_4$ gas as an etch gas. The results show that in comparison of shoulder-drop amounts, the order is P4MS>PS and P6MVN>PVN both in the L/S pattern and the CH pattern. No shoulder-drop is found in the cases of P4MS and P6MVN in which a methyl group is added to a tip of an aromatic ring. The same thing happens, similarly to in the case of acrylic polymers, when the aromatic ring with high RIE resistance is replaced with an anthracene ring or a phenanthrene ring. An ethyl group has a larger shoulder-drop prevention effect than a methyl group. However, an excessively extended alkyl group causes deterioration of etch resistance, which is quite important. Therefore, the carbon number of the alkyl group is preferable to be 6 or less.

Example 2, Comparative Example 3

Figure 8:
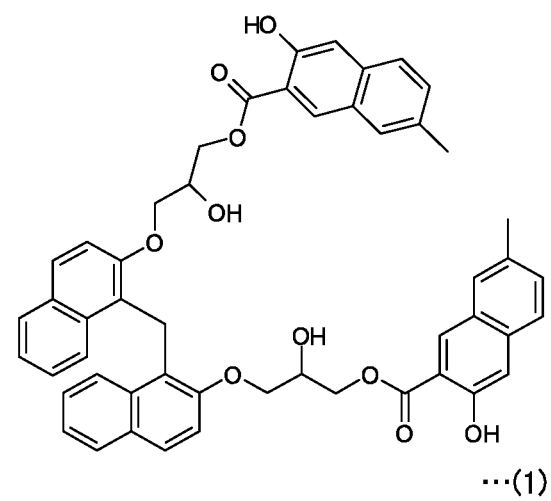
FIG. 8 is a diagram illustrating an organic polymer used as an etch mask in Example 2.

To Example 2 and Comparative Example 3, an organic compound having an aromatic ring structure is applied. As Example 2, 0.5 mol 2,2'-[methylenebis(1,2-naphtalenediyloxymethylene)]bis[oxirane] (CAS No.: 1059-93-4) and 1.0 mol 3-hydroxy-7-methyl-2-naphthalenecarboxylic acid (CAS No.: 143355-55-9) are dissolved in a 2-methoxy-1-propanol solution, 0.025 mol benzyltriethylammonium chloride is added, and a reaction is performed at 120° C. for 8 hours. A reaction product receives an addition of 1 L methylisobutylketone (MIBK) and is put into a separating funnel, and then is washed in pure water several times. An organic phase is dried under a reduced pressure, and an individual chemical compound (1) illustrated in FIG. 8 is retrieved.

Figure 9:
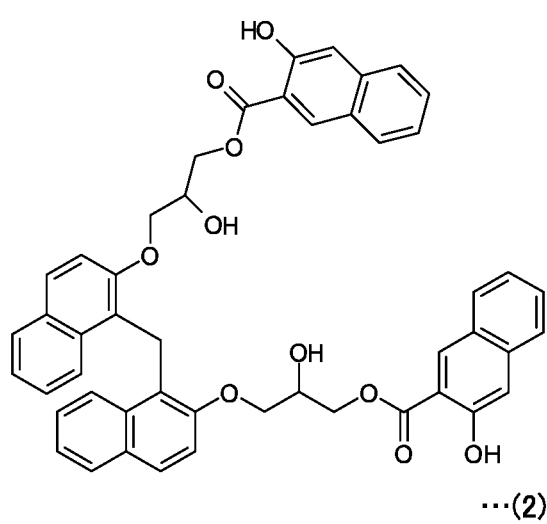
FIG. 9 is a diagram illustrating an organic polymer used as an etch mask in Comparative Example 3.

As Comparative Example 3, a similar reaction is performed by using 3-hydroxy-2-naphthalenecarboxylic acid (CAS No: 92-70-6) instead of 3-hydroxy-7-methyl-2-naphthalenecarboxylic acid, and an individual chemical compound (2) illustrated in FIG. 9 is retrieved.

As a crosslinking agent, 1,3,4, 6-tetrakis(methoxymethyl) glycoluril (CAS No.: 17464-88-9) and tripropylammonium methyl trifluoromethanesulfonate (CAS No.: 1001324-50-0) are dissolved in a PGMEA solvent, and annealing is performed at 250° C. for 60 seconds. The presence of PGMEA solvent resistance is confirmed by this annealing at 250° C. or more. A film thickness is adjusted to be about 1.0 μm by a concentration and a rotation number. Thereon, JSR NSC SOG270-61 is applied in a thickness of 50 nm as SOG, and the SOG is cured at 200° C. Further, thereon, an i-line resist (Fuji, FHi-672B) is applied in a thickness of 0.4 μm. A line-and-space (L/S) pattern and contact hole (CH) pattern are impressed by using an i-line exposure unit, and development is carried out with a TMAH aqueous solution to thereby perform patterning. After the SOG is removed by $CF_4$RIE with the obtained resist pattern being used as a mask, $O_2$RIE is performed, the above-described polymer film is etched to transfer the pattern, and thereafter, the resist is removed with the PGMEA solvent.

RIE is performed on each sample described above by using a $CF_4$ gas as an etch gas. The results show that in comparison of shoulder-drop amounts, the order is chemical compound (1)<chemical compound (2) both in the L/S pattern and the CH pattern. Thereby, it is found that adding a methyl group on an outer side of an aromatic ring reduces shoulder-drop.

Figure 10:
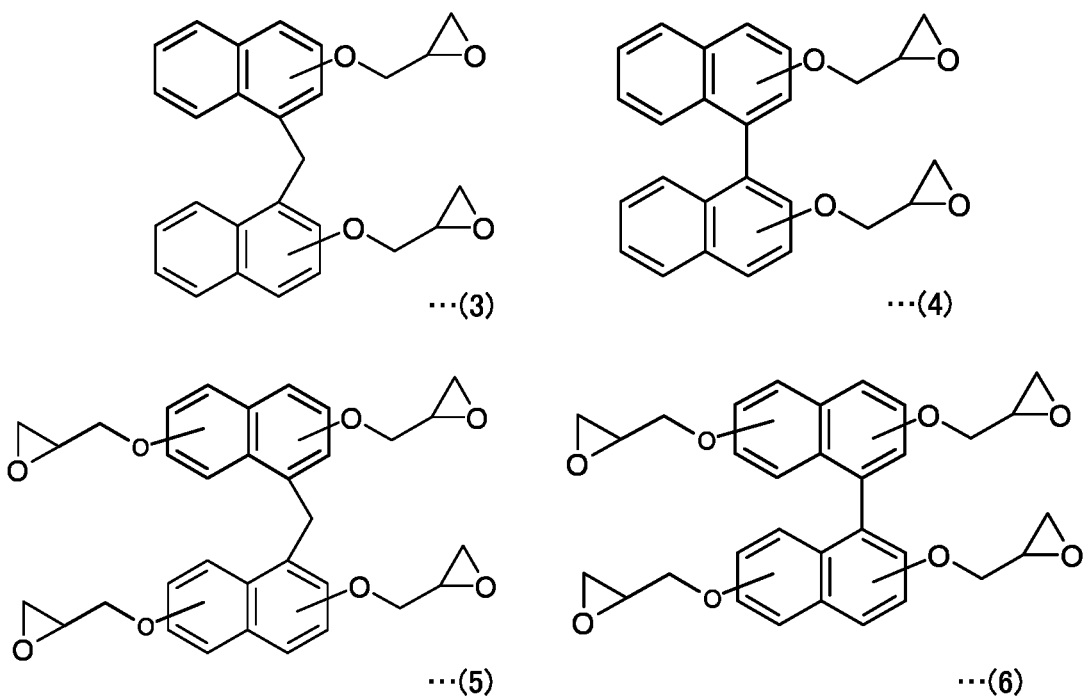
FIG. 10 is a diagram illustrating a chemical compound which can replace a part of the organic polymer used in Example 2.
Figure 11:
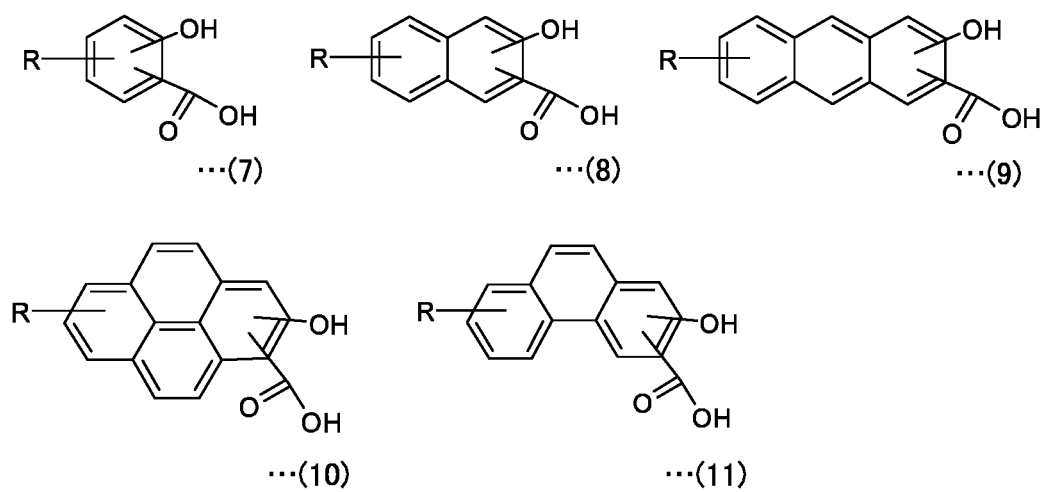
FIG. 11 is a diagram illustrating a chemical compound which can replace a part of the organic polymer used in Example 2.

Here, even when chemical compounds (3) to (6) illustrated in FIG. 10 are used instead of 2,2'-[methylenebis(1, 2-naphtalenediyloxymethylene)]bis[oxirane], similar results can be obtained. Further, even when chemical compounds (7) to (11) illustrated in FIG. 11 are used instead of 3-hydroxy-7-methyl-2-naphthalenecarboxylic acid, similar results can be obtained. In FIG. 11, R indicates an alkyl group whose carbon number is 1 to 6.

Example 3

In a solvent (toluene, THF, methylene chloride), 30 mmol B,B'-[2,5-Bis(methoxymethyl)-1,4-phenylene]bis[boronic acid] (CAS: 957121-03-8) and 30 mmol 2',5'-Diiodo-1,1': 4',1"-terphenyl (CAS: 96843-21-9) are dissolved, to make an argon atmosphere. Further, 1M potassium carbonate is added. Commercially available materials are used without refining.

Figure 12:
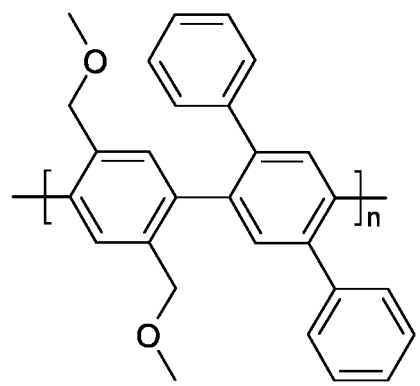
Figure 12:
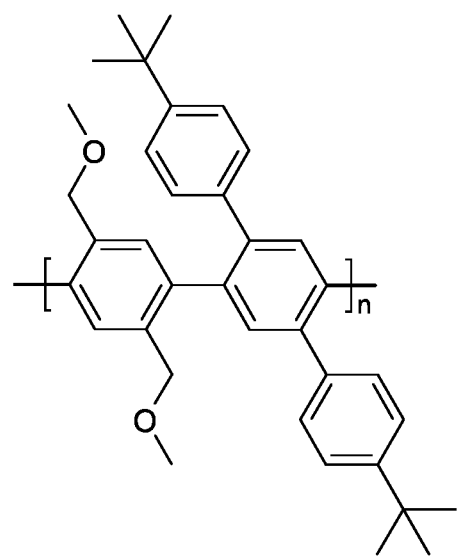

A toluene solution of Tetrakis(triphenylphosphine)palladium(0) is added and a mixture is fluxed for 10 hours. After precipitation with methanol, filtration is performed. Further, a filtered product is washed with pure water and thereafter redissolved in methylene chloride. An obtained solution is dried and a polymer A illustrated in FIG. 12 is obtained.

Further, 1,1':4',1"-Terphenyl,4,4"-bis(1,1-dimethylethyl)-2',5'-diiodo-(CAS: 959712-69-7) is synthesized in accordance with a literature (J. Am. Chem. Soc., 2007, 129, 14116). By using this instead of 2',5'-Diiodo-1,1':4',1"-terphenyl, similar polymerization is performed and a polymer B illustrated in FIG. 12 is obtained.

The obtained polymer A and polymer B are dissolved in toluene and spin-coating is performed. Thereon, JSR NSC SOG270-61 is applied in a thickness of 50 nm as spin on glass (SOG), and the SOG is cured at 200° C. Further, thereon, an i-line resist (Fuji, FHi-672B) is applied in a thickness of 0.4 μm. A line-and-space (L/S) pattern and a contact hole (CH) pattern are impressed by using an i-line exposure unit, and development is carried out with a tetramethylammonium hydroxide (TMAH) aqueous solution, to thereby perform patterning. After the SOG is removed by $CF_4$RIE with the obtained resist pattern being used as a mask, $O_2$RIE is performed and the above-described polymer film is etched to transfer the pattern, and thereafter, the resist is removed with a PGMEA solvent.

RIE is performed on each sample described above by using a $CF_4$ gas as an etch gas. The results show that in comparison of shoulder-drop amounts, the order is polymer A>polymer B both in the L/S pattern and the CH pattern, a rectangular property being maintained more in the polymer B. Thereby, it is found that the shoulder-drop amount is smaller when alkane is added to a side chain also in the case of a phenylene-based polymer whose main chain is constituted by an aromatic ring.

Figure 13:
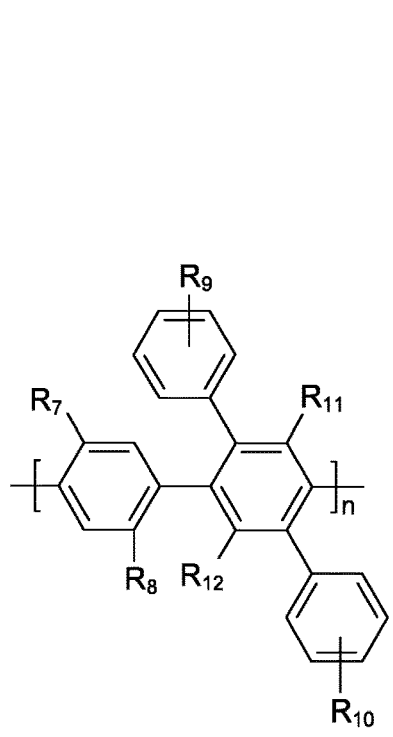
Figure 13:
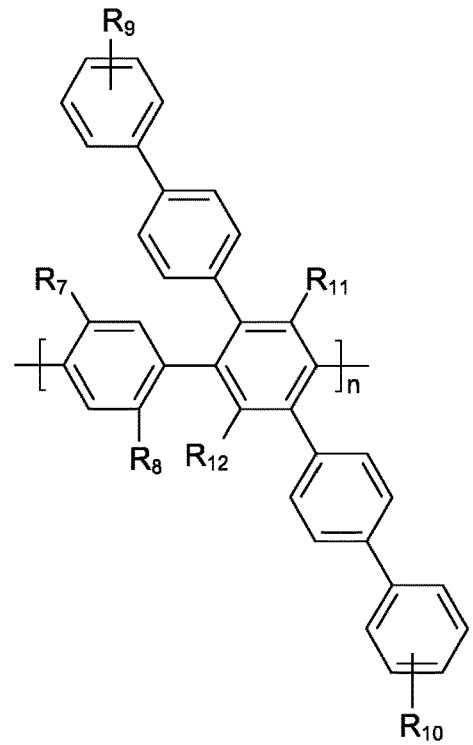
Figure 13:
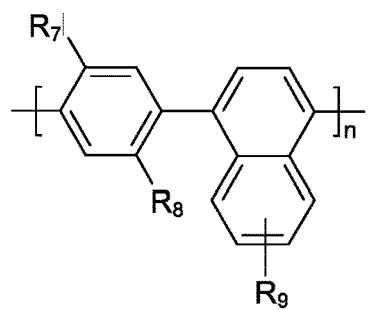
Figure 13:
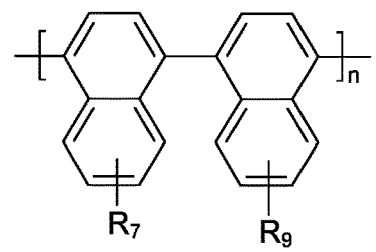
Figure 13:
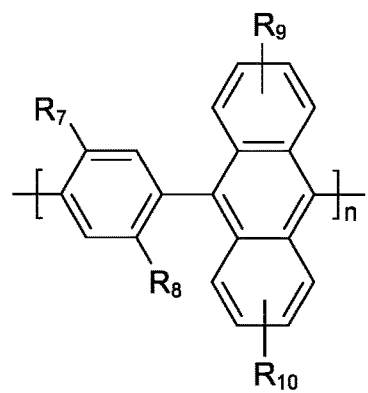

As similar structures, the structures illustrated in FIG. 13 also exhibit similar properties.

In FIG. 13, $R_7$ and $R_8$ may be the same or different, being hydrogen, a hydroxyl group, a carboxyl group, a formyl group, or an alkyl group whose carbon number is 1 to 6. $R_9$ and $R_{10}$ may be the same or different, being an alkyl group whose carbon number is 1 to 6. $R_{11}$ and Ru may be the same or different, being hydrogen or a phenyl group.

Several embodiments of the present invention have been explained, but these embodiments have been presented by way of example only, and are not intended to limit the scope of the invention. Those embodiments can be embodied in a variety of other forms, and various omissions, substitutions and changes may be made without departing from the spirit of the invention. These embodiments and their modifications are included in the scope and gist of the invention and are included in the invention described in claims and their equivalents.

What is claimed is:

1. A method of forming a pattern comprising:
    forming an etch mask on a film by using a pattern-forming material containing an organic polymer;
    patterning the etch mask, wherein
    the organic polymer includes a main chain having an aromatic ring, and the organic polymer includes alkane or cycloalkane whose carbon number is 1 or more and 6 or less at a position which is apart by 4 or more in the number of atoms from the main chain, and
    the organic polymer contains 70 atom % or more carbon atoms having an $sp^2$ orbital and 5 atom % or more carbon atoms having an $sp^3$ orbital among the carbon atoms constituting the organic polymer.

2. The method according to claim 1, wherein 80 atom % or more of the carbon atoms having the $sp^2$ orbital is constituted by the aromatic ring.

3. The method according to claim 1, further comprising infiltrating the pattern-forming material with a metallic compound to form a composite film containing metal as the etch mask.

* * * * *